(12) United States Patent
Onishi et al.

(10) Patent No.: US 10,770,580 B2
(45) Date of Patent: Sep. 8, 2020

(54) SEMICONDUCTOR DEVICE

(71) Applicants: TOYOTA JIDOSHA KABUSHIKI KAISHA, Toyota-shi, Aichi-ken (JP); DENSO CORPORATION, Kariya, Aichi-pref. (JP)

(72) Inventors: Toru Onishi, Nagoya (JP); Sachiko Aoi, Nagakute (JP); Yasushi Urakami, Kariya (JP)

(73) Assignees: TOYOTA JIDOSHA KABUSHIKI KAISHA, Toyota (JP); DENSO CORPORATION, Kariya (JP)

( * ) Notice: Subject to any disclaimer, the term of this patent is extended or adjusted under 35 U.S.C. 154(b) by 0 days.

(21) Appl. No.: 16/341,340

(22) PCT Filed: Oct. 30, 2017

(86) PCT No.: PCT/IB2017/001303
§ 371 (c)(1),
(2) Date: Apr. 11, 2019

(87) PCT Pub. No.: WO2018/083526
PCT Pub. Date: May 11, 2018

(65) Prior Publication Data
US 2020/0052112 A1     Feb. 13, 2020

(30) Foreign Application Priority Data
Nov. 4, 2016 (JP) ................ 2016-216674

(51) Int. Cl.
*H01L 29/78* (2006.01)
*H01L 29/423* (2006.01)

(52) U.S. Cl.
CPC ...... *H01L 29/7813* (2013.01); *H01L 29/4236* (2013.01); *H01L 29/4238* (2013.01)

(58) Field of Classification Search
CPC .......... H01L 24/72; H01L 25/071; H01L 2924/10254; H01L 2924/10272;
(Continued)

(56) References Cited

U.S. PATENT DOCUMENTS 5,763,915 A * 6/1998 Hshieh ............ H01L 29/7813
257/330
9,917,111 B2 * 3/2018 Liu ................ H01L 23/5226
(Continued)

FOREIGN PATENT DOCUMENTS

EP     1 009 035 A1    6/2000
EP     1 351 313 A2    10/2003
(Continued)

OTHER PUBLICATIONS

English Translation of Office Action issued in Japanese Patent Application No. 2016-216674 dispatched Jan. 21, 2020 and drafted on Jan. 15, 2020.

*Primary Examiner* — Zandra V Smith
*Assistant Examiner* — Andre C Stevenson
(74) *Attorney, Agent, or Firm* — Oliff PLC

(57) ABSTRACT

In an end portion of a trench, an opening where the end portion of the trench is exposed is formed in a lead-out electrode, a side surface of the trench gate electrode on a top surface side of a semiconductor substrate is spaced from a trench side surface, and a range adjacent to a boundary line positioned between a top surface of the semiconductor substrate and the trench side surface is covered with a laminated insulating film configured such that an interlayer insulating film is laminated on a gate insulating film. This makes it possible to prevent dielectric breakdown of an insulating film.

6 Claims, 7 Drawing Sheets

(58) Field of Classification Search
CPC ..... H01L 2924/1033; H01L 2924/1203; H01L 2924/13055
See application file for complete search history.

(56) References Cited

U.S. PATENT DOCUMENTS

2012/0153382 A1    6/2012  Narazaki et al.
2015/0295079 A1    10/2015  Nakano et al.
2017/0062556 A1*  3/2017  Takizawa ............ H01L 29/1095

FOREIGN PATENT DOCUMENTS

| JP | 2000-200901 A | 7/2000 |
| JP | 2003-282870 A | 10/2003 |
| JP | 3960091 B2 | 8/2007 |
| JP | 2013-232533 A | 11/2013 |

\* cited by examiner

SEMICONDUCTOR DEVICE

BACKGROUND OF THE INVENTION

1. Field of the Invention

The present specification discloses a semiconductor device including a trench gate electrode and a lead-out electrode.

2. Description of Related Art

As disclosed in Japanese Patent Application Publication No. 2013-232533 (JP 2013-232533 A), there has been known a semiconductor device configured such that a trench extending to a deep side from a top surface of a semiconductor substrate is provided, and a trench gate electrode is accommodated in the trench. In the semiconductor device, it is necessary to make the trench gate electrode conductive with a gate wiring line, and a lead-out electrode extending along the top surface is provided on the top surface of the semiconductor substrate. The trench gate electrode is conductive with the lead-out electrode, and the lead-out electrode is conductive with the gate wiring line.

In a range adjacent to a border between the top surface of the semiconductor substrate (hereinafter referred to as the top surface) and a side surface of the trench (hereinafter referred to as the side surface), the top surface makes contact with the side surface. In the vicinity of the border, a steep edge or a steep corner with a small curvature radius (both generally referred to as a steep portion) exists between the top surface and the side surface. An inner surface of the trench is covered with a thin gate insulating film, and the steep portion is also covered with the thin gate insulating film.

When the semiconductor substrate is planarly viewed, the trench often extends linearly on the top surface of the semiconductor substrate. In this case, when the semiconductor substrate is planarly viewed, a trench side surface extends linearly. However, when the semiconductor substrate is planarly viewed, the trench side surface curves in the vicinity of a longitudinal end of the trench, and the longitudinal end of the trench is formed by the trench side surface thus curving in a plan view. In the present specification, a range where the trench side surface extends linearly when the semiconductor substrate is planarly viewed is referred to as a linear portion, and a range where the trench side surface curves is referred to as an end portion. The end portions are positioned on both longitudinal end sides of the linear portion. Also in the end portion, the steep portion is covered with the gate insulating film.

In the steep portion, a large electric field easily acts on the gate insulating film. Particularly, the steep portion in the end portion curves in a plane of the semiconductor substrate planarly viewed and also curves in a section perpendicular to the semiconductor substrate, and those curves are combined. A particularly large electric field easily acts on the gate insulating film covering the steep portion in the end portion, so that dielectric breakdown easily occurs. A film thickness of the gate insulating film affects a threshold voltage of the semiconductor device, so it is difficult to secure a withstand voltage just by thickening the gate insulating film.

JP 2013-232533 A discloses a technique in which the film thickness of the gate insulating film covering the steep portion is increased locally so as to prevent dielectric breakdown of the gate insulating film covering the steep portion. That is, JP 2013-232533 A discloses a technique in which the film thickness of the gate insulating film is decreased in a range other than the steep portion, and the film thickness of the gate insulating film is increased in a range of the steep portion. Note that, in JP 2013-232533 A, it is not recognized that dielectric breakdown more easily occurs in the steep portion of the end portion than in the steep portion of the linear portion, and the film thickness of the gate insulating film in the vicinity of the steep portion is increased uniformly in the linear portion and the end portion.

SUMMARY OF THE INVENTION

The steep portion is positioned on an opening side of the trench. When the gate insulating film covering the steep portion positioned on the opening side is thickened, and the gate insulating film on a deeper side relative to the opening side is thinned, an eaves-shaped overhang projecting into the trench is formed on the opening side due to the thick gate insulating film. It is difficult to fill a conductive material into the trench where the eaves-shaped overhang is formed. In the technique of JP 2013-232533 A, the opening is closed while the conductive material is filled into the trench, which causes a case where a necessary trench gate electrode cannot be formed. Even in a case where a thick insulating film is formed on a bottom of the trench, the eaves-shaped overhang becomes an obstacle. The present specification discloses a technique which does not cause any inconvenience for formation of a trench gate electrode and the like and which can prevent dielectric breakdown of a gate insulating film.

The technique disclosed in the present specification uses such a phenomenon that dielectric breakdown more easily occurs in a steep portion of an end portion than in a steep portion of a linear portion. That is, the technique aims at an effective measure to dielectric breakdown by making it difficult to cause dielectric breakdown in the steep portion of the end portion.

In a semiconductor device in the related art, in the vicinity of a steep portion of a trench end portion, a trench gate electrode is opposed to a side surface of a trench via a gate insulating film, and a lead-out electrode is opposed to a top surface of a semiconductor substrate via a gate insulating film. Because the gate insulating film is thin, a problem occurs.

The technique disclosed in the present specification employs such a configuration that, in the vicinity of a steep portion of an end portion, a laminated insulating film configured such that an interlayer insulating film is laminated on a gate insulating film is provided between a side surface of a trench and a trench gate electrode, and a laminated insulating film configured such that an interlayer insulating film is laminated on a gate insulating film is also provided between a top surface of a semiconductor substrate and a lead-out electrode.

A semiconductor device according to a first aspect of this disclosure includes: a semiconductor substrate; a trench provided on a top surface of the semiconductor substrate; a gate insulating film covering an inner surface of the trench; a trench gate electrode adjacent to the gate insulating film and accommodated in the trench; and a lead-out electrode provided on the top surface so as to extend along the top surface, the lead-out electrode being electrically connected to the trench gate electrode, wherein:

when the top surface of the semiconductor substrate is planarly viewed from above, the trench has a linear portion in which a trench side surface extends linearly, and an end portion in which the trench side surface curves, the end portion being positioned on a longitudinal end side of the linear portion; when the top surface of the semiconductor substrate is planarly viewed from above, the lead-out electrode covers the end portion and reaches the linear portion; and when the top surface of the semiconductor substrate is planarly viewed from above, in an adjacent range in the end portion, the adjacent range being adjacent to a boundary line positioned between the top surface and the trench side surface, the top surface and the trench side surface are covered with the gate insulating film and an interlayer insulating film.

In the above semiconductor device, in the vicinity of a steep portion of a trench end portion where dielectric breakdown easily occurs, the trench side surface and the top surface of the semiconductor substrate are both covered with a thick laminated insulating film, so that dielectric breakdown does not occur.

In the above aspect, an opening where the end portion (the trench end portion) is exposed may be formed in the lead-out electrode. This easily realizes a structure where the top surface of the semiconductor substrate in the vicinity of the steep portion of the trench end portion is covered with the laminated insulating film.

In the above aspect, in order to cover the trench side surface in the vicinity of the steep portion of the trench end portion with the laminated insulating film, it is preferable that the side surface of the trench gate electrode be spaced from the trench side surface. This easily realizes a structure in which the trench side surface in the vicinity of the steep portion of the trench end portion is covered with the laminated insulating film.

In the above aspect, the interlayer insulating film may continue to an insulating film that insulates a gate electrode from a top surface electrode. This does not increase the number of formation steps of the interlayer insulating film.

In the above aspect, a plurality of trenches may extend in parallel to each other, and respective end portions of the trenches adjacent to each other may be placed at different longitudinal positions. Hereby, in a case where openings are formed in the lead-out electrode (the openings correspond to respective trenches), when the openings are arranged in the same straight line, a sectional area of the lead-out electrode in a section along the straight line decreases, so that a resistance from a contact region with a gate wiring line to a contact region with the trenches increases. When the trench end portions are placed alternately at different longitudinal positions, the openings can be easily placed in a zigzag manner, thereby making it possible to prevent an increase in the resistance.

In the above aspect, the lead-out electrode and a gate wiring line may make contact with each other at a position on an extension line extending from the trench longitudinally. This makes it possible to prevent a wasteful area in the semiconductor substrate.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

The following makes a list of features of embodiments described below. (1) A top surface of a trench gate electrode is aligned with a top surface of a semiconductor substrate, and an interlayer insulating film does not enter a trench. (2) The top surface of the trench gate electrode is engraved in a trench end portion. (3) In the trench end portion, the trench gate electrode is not opposed to a trench side surface on a top surface side of the semiconductor substrate. (4) In the trench end portion, the trench gate electrode is opposed to the trench side surface on the top surface side of the semiconductor substrate via a laminated insulating film. (5) The top surface of the trench gate electrode is placed at a position deeper than the top surface of the semiconductor substrate, and the interlayer insulating film enters the trench. (6) On a bottom surface of a lead-out electrode, an invasion portion extending from the bottom surface to enter the trench is formed. (7) The invasion portion is constituted by a linear portion of the trench.

Figure 1:
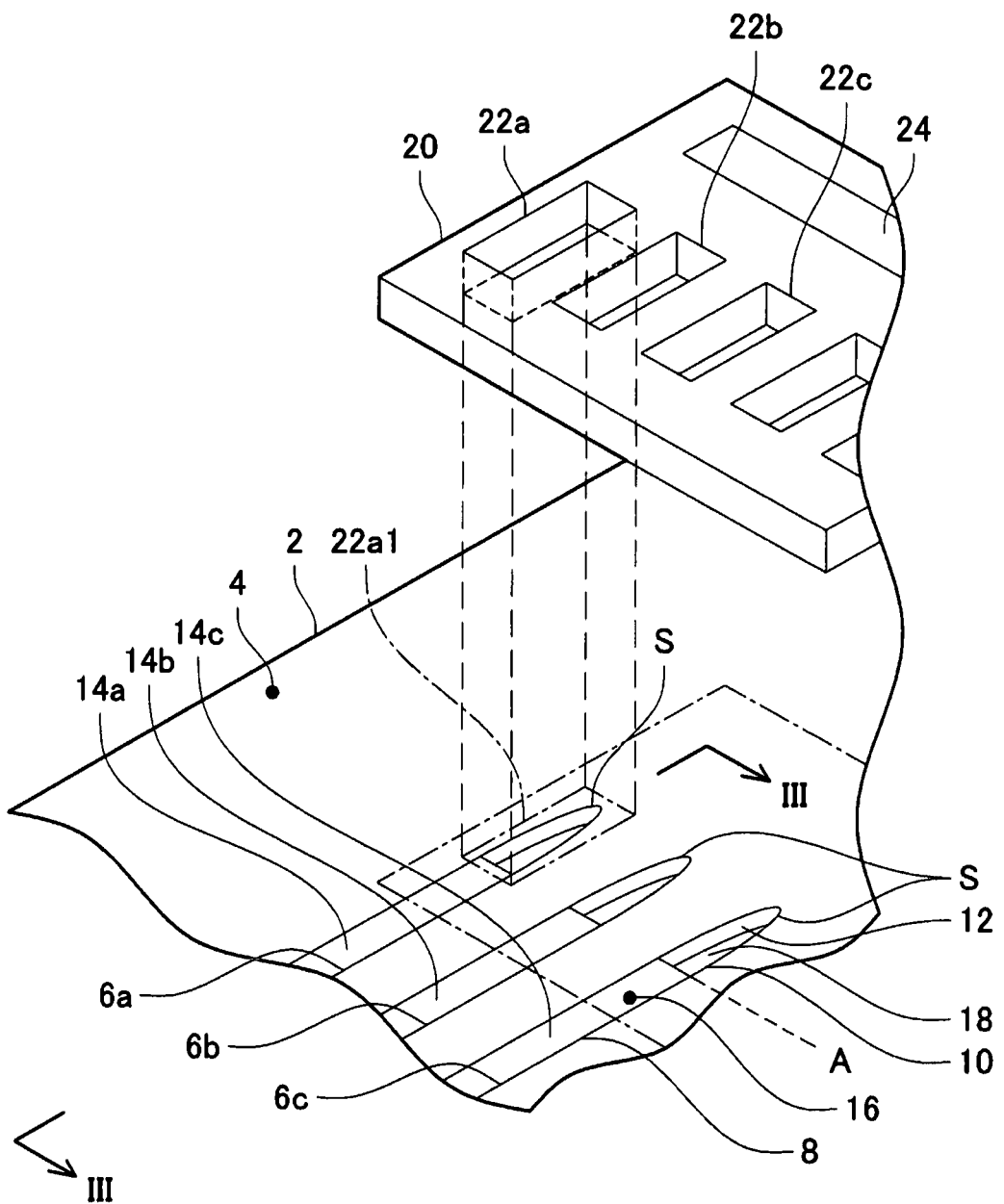
FIG. 1 is an exploded perspective view schematically illustrating a relationship between a trench, a trench gate electrode, and a lead-out electrode of a semiconductor device of Embodiment 1.

FIG. 1 is an exploded perspective view schematically illustrating a semiconductor device including a trench gate electrode 14 and a lead-out electrode 20 disclosed in the present specification. In practice, a top surface 4 of a semiconductor substrate 2 is not separated from the lead-out electrode 20.

In FIG. 1, a reference numeral 2 is a semiconductor substrate, and trenches 6 extend linearly on its top surface 4. In FIG. 1, three trenches 6a, 6b, 6c extend in parallel to each other. In the present specification, subscripts a, b, c, . . . are individually attached to a plurality of the same members. When a common phenomenon is described, the subscripts are omitted. Note that the scope of the present technique is not limited to the number of trenches 6.

An inner surface of the trench 6 is covered with a gate insulating film (not shown), and the trench gate electrode 14 is accommodated therein. In the present embodiment, a top surface 16 of the trench gate electrode 14 is generally aligned with the top surface 4 of the semiconductor substrate 2. The lead-out electrode 20 is provided on the top surface 4 of the semiconductor substrate 2 and the top surface 16 of the trench gate electrode 14, so as to extend along the top surfaces 4, 16. An opening 22 formed in the lead-out electrode 20 and a hollow formed in an end portion of the trench gate electrode 14 are constituents inherent to Embodiment 1, and do not exist in related arts. The constituents inherent to Embodiment 1 will be described later. In the present specification, the same reference numeral is assigned to a member that has been already described through the related arts and Embodiments, and a redundant description is omitted.

Figure 7:
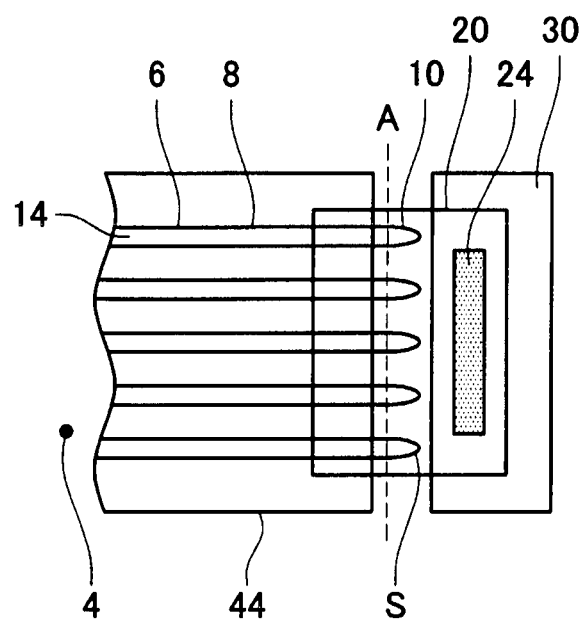
FIG. 7 is a plan view of a semiconductor device in a related art.
Figure 8:
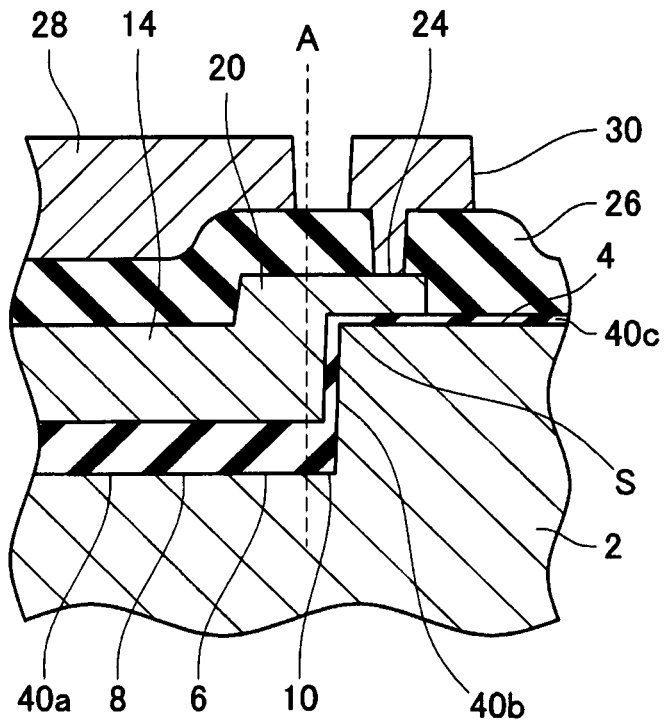
FIG. 8 is a sectional view of the semiconductor device in the related art.

(Related Art 1) The related arts will be described more specifically first, so as to facilitate the understanding of Embodiments. In Related Art 1, the opening 22 illustrated in FIG. 1 does not exist, and no hollow is formed in an end portion of a trench gate electrode 14. FIG. 7 is a plan view of a semiconductor device in Related Art 1. A plurality of trenches 6 extends in parallel to each other on a top surface of a semiconductor substrate. On a left side relative to a line A in FIG. 7, a trench side surface extends linearly when the semiconductor substrate is planarly viewed, and this part is referred to as a linear portion 8. On a right side relative to the line A in FIG. 7, the trench side surface curves when the semiconductor substrate is planarly viewed, and this part is referred to as an end portion 10. A reference numeral 20 indicates a formation range of a lead-out electrode, a reference numeral 30 indicates a formation range of a gate wiring line, and a reference numeral 24 indicates a contact region where the lead-out electrode 20 and the gate wiring line 30 make contact with each other through a contact hole formed in an interlayer insulating film 26 illustrated in FIG. 8. As illustrated in FIG. 8, other than the contact region 24, a height of the lead-out electrode 20 is different from a height of the gate wiring line 30, and the interlayer insulating film 26 is provided therebetween. A reference numeral 28 indicates a source electrode (an example of a top surface electrode), and is insulated from the gate electrode 14 by the interlayer insulating film 26.

In the related art illustrated in FIGS. 7 and 8, in the end portion 10, the trench gate electrode 14 is opposed to a side surface of the trench 6 via a gate insulating film 40b, and the lead-out electrode 20 is opposed to a top surface 4 of a semiconductor substrate 2 via a gate insulating film 40c. In this case, a large voltage difference is caused between an outer surface and an inner surface of each of the thin gate insulating films 40b, 40c, so that dielectric breakdown easily occurs. Particularly, in a steep portion (near a border between the side surface of the trench 6 and the top surface 4 of the semiconductor substrate) in the end portion 10 where dielectric breakdown easily occurs, the trench gate electrode 14 is opposed to the side surface of the trench 6 via the thin gate insulating film 40b, and the lead-out electrode 20 is opposed to the top surface 4 of the semiconductor substrate via the thin gate insulating film 40c, so that dielectric breakdown easily occurs in the steep portion of the end portion 10.

Figure 9:
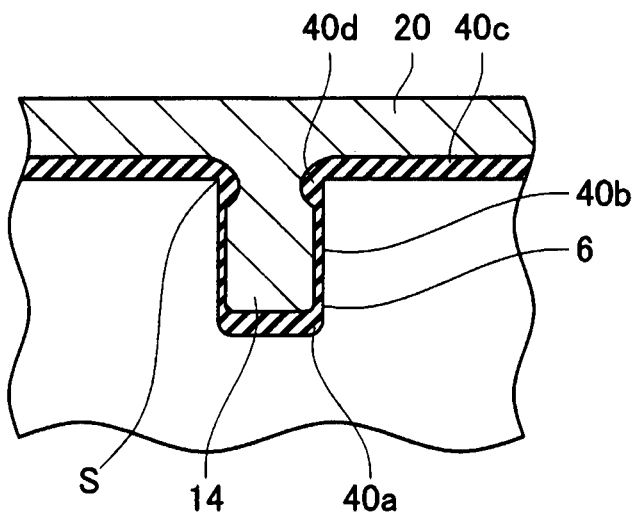
FIG. 9 is a sectional view of a semiconductor device in a related art which takes measures.

(Related Art 2) FIG. 9 illustrates one related art that deals with the problem in Related Art 1, and illustrates a cross section of a trench 6. Among gate insulating films 40a, 40b, 40c, the gate insulating film 40b covering a side surface of a trench deep part that affects a threshold voltage is thinned, and the other gate insulating films are thickened. A gate insulating film 40d covering a side surface of a trench shallow part (placed in the vicinity of a steep portion existing near a boundary between a side surface of the trench 6 and a top surface 4 of a semiconductor substrate) is thickened locally. In this structure, the insulating film is thick in the vicinity of the steep portion on which an electric field easily concentrates, the steep portion existing near the boundary between the side surface of the trench 6 and the top surface 4 of the semiconductor substrate. Accordingly, it is possible to prevent an occurrence of dielectric breakdown. However, since the insulating film 40d (positioned on an opening side of the trench) formed on the side surface is thick, the insulating film 40d overhangs inside the trench in an eaves shape, so it is difficult to fill a gate electrode 14 inside the trench.

Figure 2:
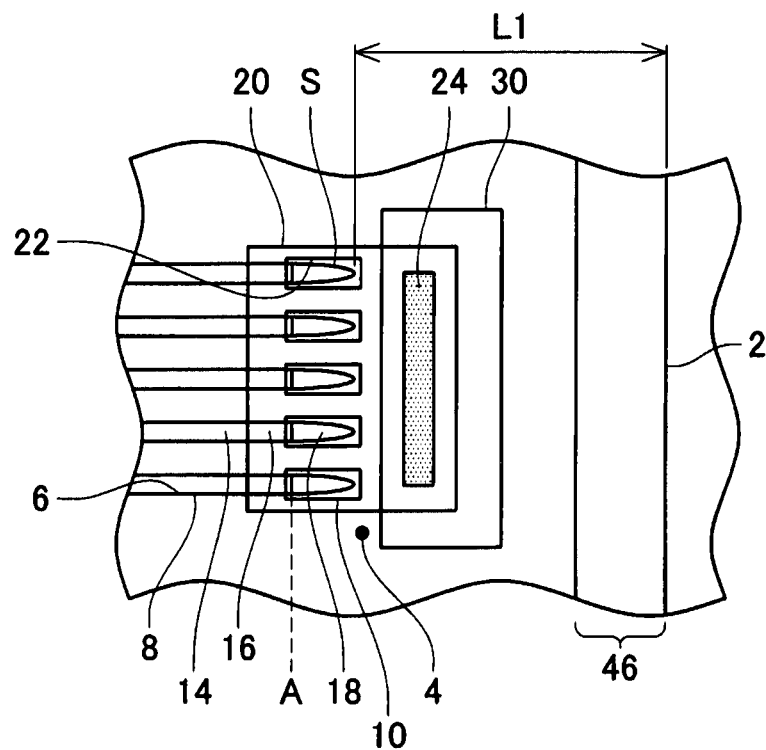
FIG. 2 is a plan view of the semiconductor device of Embodiment 1.
Figure 10:
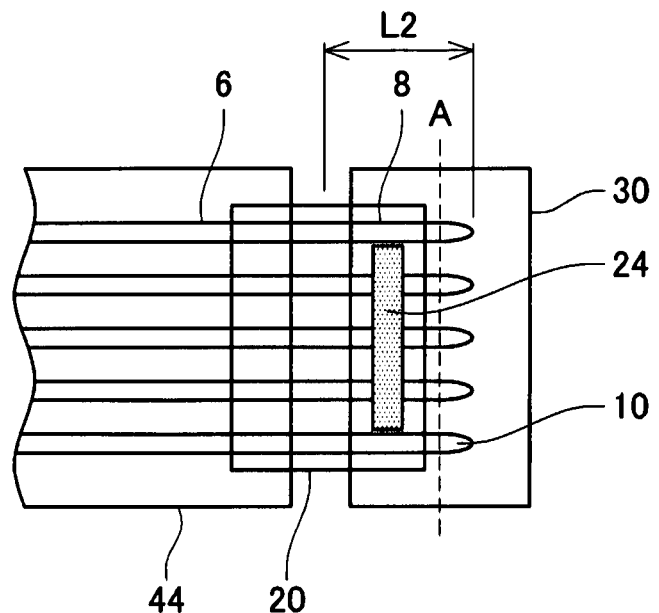
FIG. 10 is a plan view of another semiconductor device in a related art which takes measures.

(Related Art 3) In Related Art 3, an end portion 10 of a trench 6 is not covered with a lead-out electrode 20, as illustrated in FIG. 10. That is, the lead-out electrode 20 is provided within a range of a linear portion 8 of the trench 6. With this configuration, the lead-out electrode 20 does not exist in the end portion 10 on which an electric field easily concentrates, so it is possible to prevent an occurrence of dielectric breakdown. In the case of Related Art 3, it is necessary to extend the trench 6 long from an active region 44, as compared to FIG. 7. In the case of FIG. 10, the trench 6 is formed longer than the trench 6 in FIG. 7 only by a distance L2. A given distance is required between a trench end portion and a side surface of a semiconductor substrate, and when the trench is extended long, a necessary size of the semiconductor substrate is increased just by that much. In Related Art 3, a necessary size of the semiconductor substrate is upsized. As illustrated in FIG. 2, a given distance is required from a trailing end of the trench 6 in a longitudinal direction to a peripheral voltage withstanding region 46, and a given distance L1 is required from the trailing end of the trench 6 in the longitudinal direction to an outer periphery of the semiconductor substrate 2. In the case of FIG. 10, a trailing end position of the trench is shifted to an outer peripheral side of the semiconductor substrate 2 only by L2, so a necessary size of the semiconductor substrate is upsized.

Figure 11:
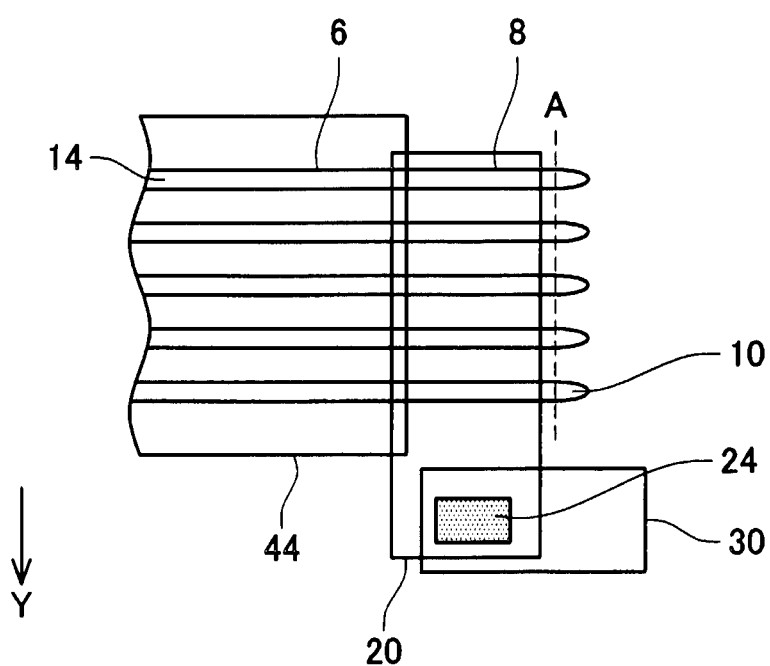
FIG. 11 is a plan view of further another semiconductor device in a related art which takes measures.

(Related Art 4) Also in Related Art 4 illustrated in FIG. 11, a lead-out electrode 20 is provided within a range of a linear portion 8 of a trench 6, similarly to FIG. 10. An end portion 10 of the trench 6 is not covered with the lead-out electrode 20. With this configuration, the lead-out electrode 20 does not exist in the end portion 10 on which an electric field easily concentrates, so it is possible to prevent an occurrence of dielectric breakdown. In this related art, a length of the trench is longer than the trench in FIG. 7. In this structure of FIG. 11, a contact region 24 for the lead-out electrode and a gate wiring line is shifted to a Y-direction illustrated herein, so the length of the trench is short as compared to FIG. 10. However, since the contact region 24 is shifted to the Y-direction, a resistance from the contact region 24 to each trench gate electrode 14 increases, which slows down a switching speed.

Figure 3:
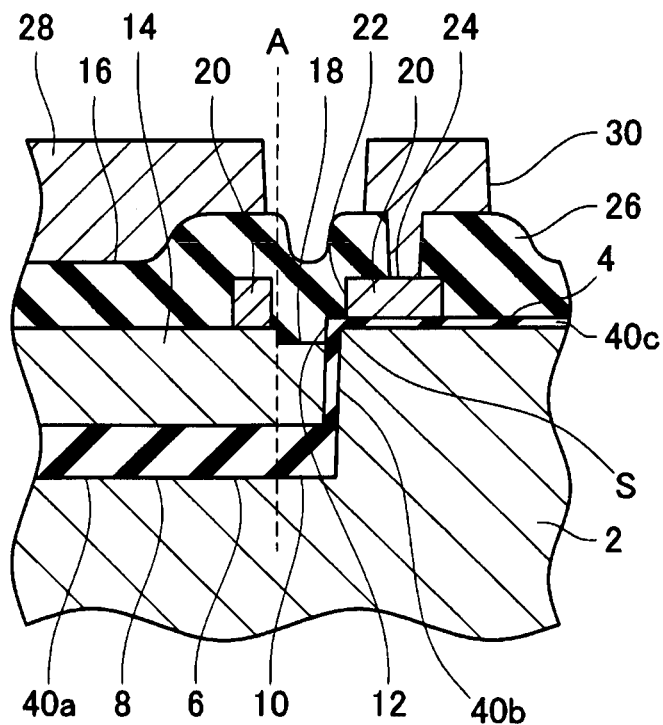
FIG. 3 is a sectional view of the semiconductor device of Embodiment 1.

In order to solve the problems of Related Arts 1 to 4, the following embodiments were developed. (Embodiment 1) As illustrated in FIGS. 1 to 3, in the present embodiment, openings 22 are formed in the lead-out electrode 20. A reference numeral 22a1 in the figure indicates a contour of an opening 22a in a state where a bottom surface of the lead-out electrode 20 makes contact with a top surface of the trench gate electrode 14. The opening 22a has a size that allows an end portion 10 of the trench 6a to be exposed, and expands outside a contour of the end portion 10. Note that, for clarification of the figure, only the reference numeral 22a1 is illustrated, and reference numerals 22b1, 22c1, and the like are not illustrated. However, the description is common to all the trenches 6a, 6b, 6c, etc.

Further, the top surface 16 of the gate electrode 14 positioned in the linear portion 8 of the trench is generally aligned with the top surface 4 of the semiconductor substrate 2. The bottom surface of the lead-out electrode 20 makes contact with the top surface of the gate electrode 14 in the linear portion 8, so that they are conductive with each other. The top surface of the gate electrode 14 is engraved in the end portion 10 of the trench 6, so that a height of a top surface 18 of the gate electrode 14 is lower than the top surface 4 of the semiconductor substrate 2 in the end portion 10. In the vicinity of a steep portion S, a trench side surface 12 is exposed to an upper part of the gate electrode 14. As is apparent from FIG. 1, the gate electrode 14 does not exist in a range opposed to the trench side surface 12 positioned in the vicinity of the steep portion S of the end portion 10. Since the gate electrode 14 does not exist in the vicinity of the steep portion S of the end portion 10, an electric field concentration does not occur in the vicinity of the steep portion S of the end portion 10, so that dielectric breakdown does not occur. Note that, in FIG. 1, the gate insulating film and the interlayer insulating film are not illustrated. The trench side surface 12 positioned in the vicinity of the steep portion S of the end portion 10 is covered with a laminated insulating film configured such that an interlayer insulating film is laminated on a gate insulating film.

FIG. 2 is a plan view of the semiconductor device of FIG. 1. Obviously, the top surface 4 of the semiconductor substrate positioned in the vicinity of the steep portion S of the end portion 10 is exposed to the opening 22, and is not covered with the lead-out electrode 20. Since the lead-out electrode 20 does not exist in the vicinity of the steep portion S of the end portion 10, an electric field concentration does not occur in the vicinity of the steep portion S of the end portion 10, so that dielectric breakdown does not occur. Note that, in FIG. 2, the gate insulating film and the interlayer insulating film are not illustrated. The top surface 4 of the semiconductor substrate positioned in the vicinity of the steep portion S of the end portion 10 is covered with the laminated insulating film configured such that the interlayer insulating film is laminated on the gate insulating film.

FIG. 3 is a sectional view of the semiconductor device of FIGS. 1 and 2. The trench side surface 12 positioned in the vicinity of the steep portion S of the end portion 10 is covered with a laminated insulating film configured such that an interlayer insulating film 26 is laminated on a gate insulating film 40b. The top surface 4 of the semiconductor substrate positioned in the vicinity of the steep portion S of the end portion 10 is also covered with a laminated insulating film configured such that the interlayer insulating film 26 is laminated on a gate insulating film 40c. In the end portion 10, the trench gate electrode 14 does exist and the lead-out electrode 20 also does not also exist in the vicinity of the steep portion S. This prevents dielectric breakdown in the end portion 10 where dielectric breakdown easily occurs.

Figure 4:
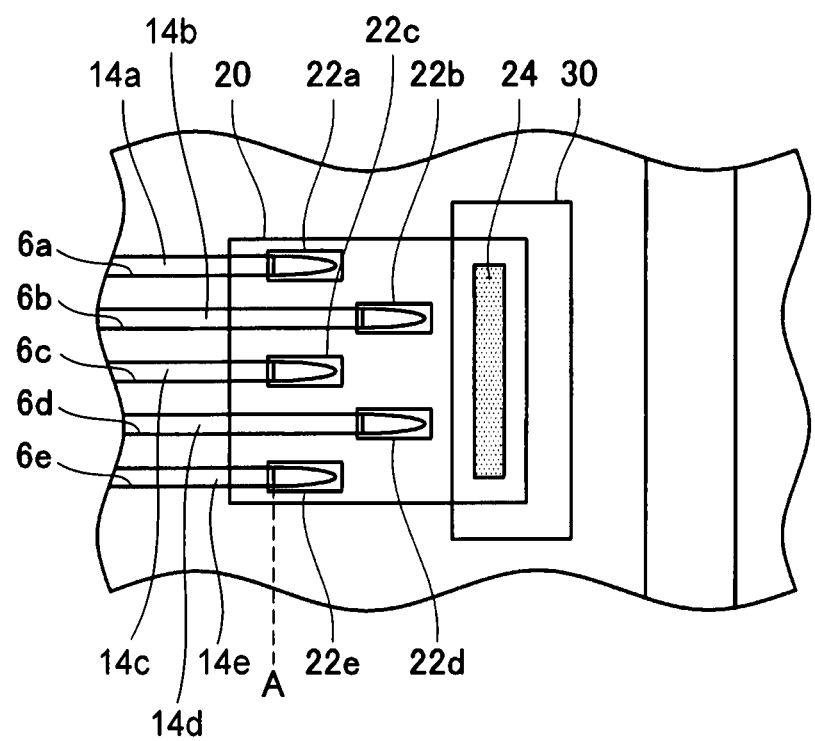
FIG. 4 is a plan view of a semiconductor device of Embodiment 2.

(Embodiment 2) The following description of Embodiment 2 only deals with differences from Embodiment 1. In Embodiment 2, as illustrated in FIG. 4, trench end portions of adjacent trenches are placed at different longitudinal positions. Along with this, openings 22 of the adjacent trenches are also placed at different longitudinal positions. In the case of FIG. 2, a sectional area, perpendicular to a current application direction, of the lead-out electrode 20 existing between adjacent openings 22, 22 is small. On this account, a resistance from a contact 24 to a trench gate electrode 14 may increase. In the case of FIG. 4, an each distance between the adjacent openings 22a to 22e is long, so that the sectional area, perpendicular to the current application direction, of the lead-out electrode 20 existing between the adjacent openings 22a to 22e is large. This makes it possible to restrain an increase in a resistance from the contact 24 to the trench gate electrodes 14a to 14e, respectively.

Figure 5:
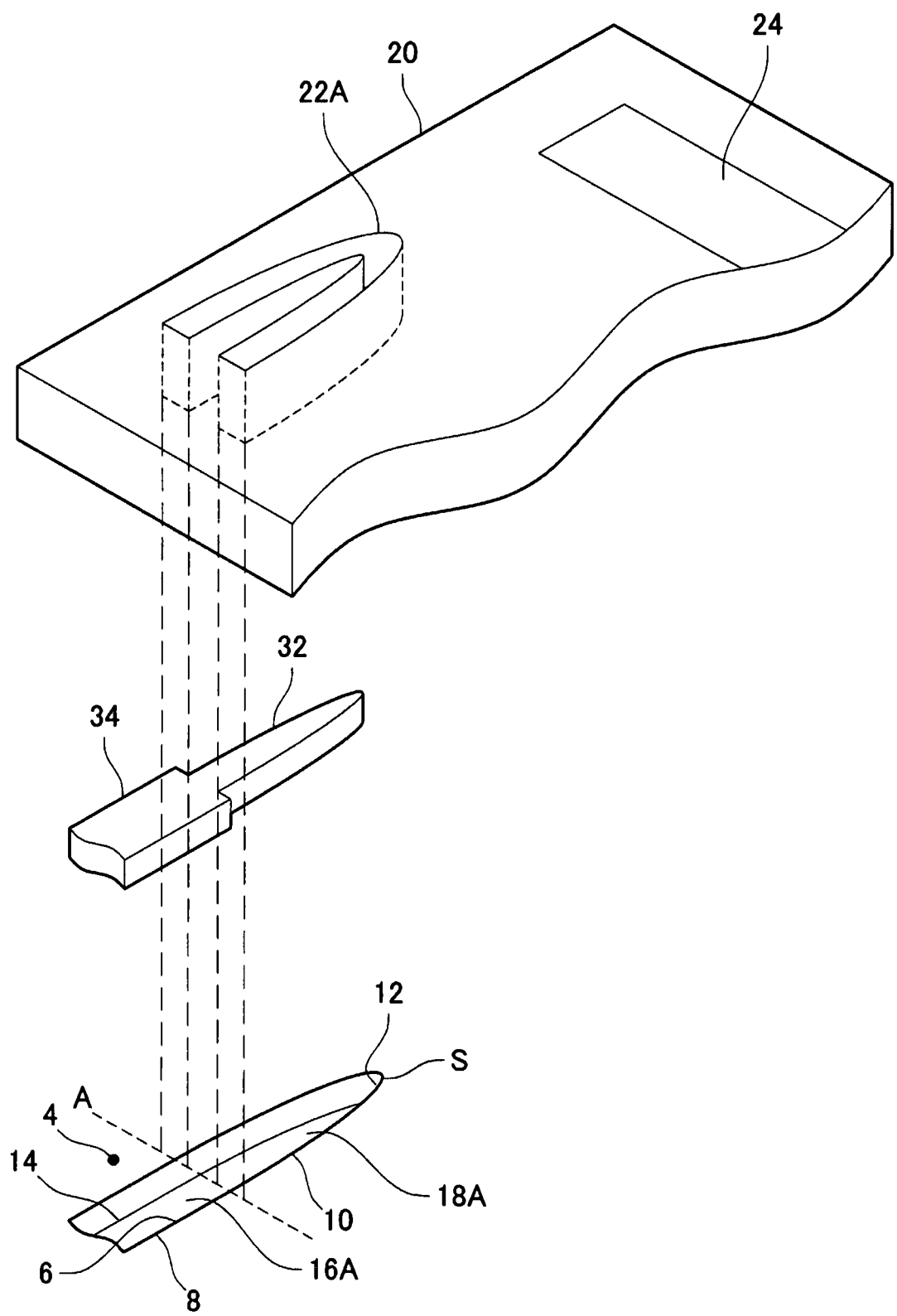
FIG. 5 is an exploded perspective view schematically illustrating a relationship between a trench, a trench gate electrode, and a lead-out electrode of a semiconductor device of Embodiment 3.
Figure 6:
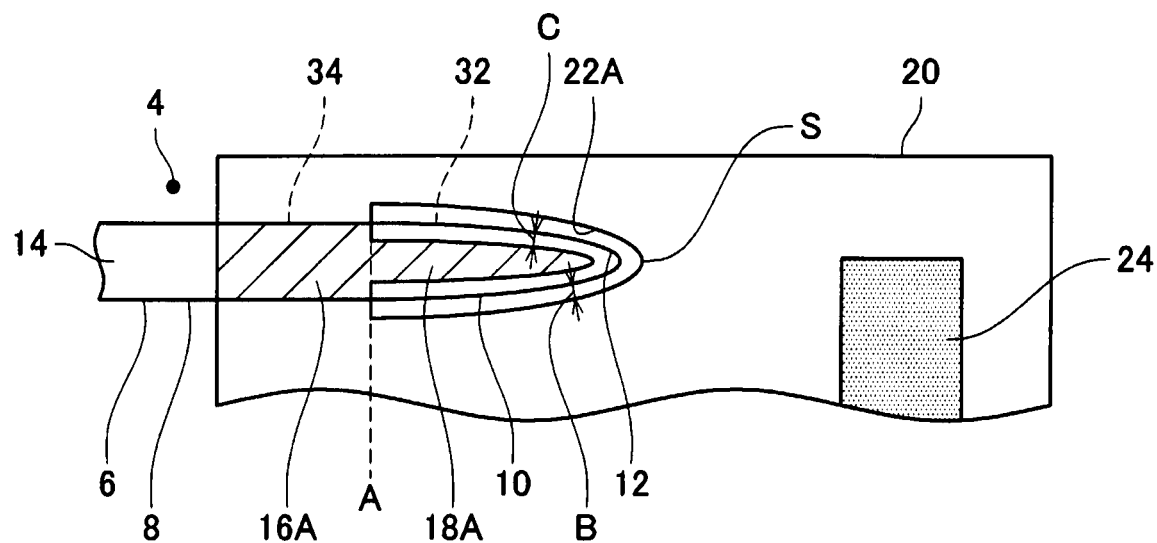
FIG. 6 is a plan view of the semiconductor device of Embodiment 3.

(Embodiment 3) First Difference In Embodiment 3, as illustrated in FIG. 5, top surfaces 16A, 18A of a trench gate electrode 14 are lower than a top surface 4 of a semiconductor substrate 2. That is, the top surface 16A of a linear portion 8 and the top surface 18A of an end portion 10 are placed at a height of the top surface 18 of the end portion 10 in FIG. 1. Second Difference In Embodiment 1, a shape of the opening 22 is rectangular. However, in Embodiment 3, an opening 22A having a shape along a steep portion S of an end portion 10 is provided. As illustrated in FIG. 6, when the semiconductor substrate 2 is planarly viewed, the opening 22A has a contour extending at a position distanced outwardly from the steep portion S only by a distance B, and a contour extending at a position distanced inwardly from the steep portion S only by a distance C. The top surface 4 of the semiconductor substrate within a range of the distance B from the steep portion S is not covered with a lead-out electrode 20. The distances B, C are determined in consideration of manufacturing tolerance. The distances B, C have a relationship that a contour of an opening of the end portion 10 of the trench 6 is observed on a bottom surface of the opening 22A against variations in machining. Third Difference Within the hatch illustrated in FIG. 6, a bottom surface of the lead-out electrode 20 projects downward and makes contact with the top surfaces 16A, 18A of the trench gate electrode (the top surfaces 16A, 18A of the trench gate electrode are lower than the top surface 4 of the semiconductor substrate 2, and therefore, if the bottom surface of the lead-out electrode 20 does not project downward, the trench gate electrode 14 does not make contact with the lead-out electrode 20). Reference numerals 32, 34 in FIG. 5 indicate projecting portions (for clarification, they are illustrated in a state where they are separated from the lead-out electrode). The projecting portion 34 enters the trench 6 in the linear portion 8, so as to make contact with the top surface 16A in the linear portion 8. The projecting portion 32 enters the trench 6 in the end portion 10, so as to make contact with the top surface 18A in the end portion 10. A side surface of the projecting portion 32 is shifted inwardly from a trench side surface 12 inside the end portion 10 only by a distance C (see FIG. 6), so that they do not make close contact with each other. An interlayer insulating film (not illustrated in FIGS. 5 and 6) is filled in a gap therebetween. The projecting portions 32, 34 enter the trench 6, so as to serve as a part of the trench gate electrode. It may be said that a part other than the projecting portions 32, 34 serves as the lead-out electrode 20.

Even in Embodiment 3, the trench side surface 12 positioned in the vicinity of the steep portion S of the end portion 10 is covered with a laminated insulating film configured such that an interlayer insulating film (an equivalent to the reference numeral 26 in FIG. 2) is laminated on a gate insulating film (an equivalent to the reference numeral 40b in FIG. 2), and is opposed to the gate electrode 32 via the laminated insulating film. The top surface 4 of the semiconductor substrate 2 positioned in the vicinity of the steep portion S of the end portion 10 is also covered with a laminated insulating film configured such that the interlayer insulating film (the equivalent to the reference numeral 26 in FIG. 2) is laminated on a gate insulating film (an equivalent to the reference numeral 40c in FIG. 2), and is not opposed to the lead-out electrode 20. The end portion 10 in the vicinity of the steep portion S is covered with the laminated insulating film. In the vicinity of the steep portion S of the end portion 10, the semiconductor substrate is not opposed to the gate electrode only via a thin gate insulating film. This prevents dielectric breakdown in the vicinity of the steep portion S of the end portion 10 where dielectric breakdown easily occurs. In the present specification, a part covered with the interlayer insulating film is referred to as a gate electrode, and a gate electrode in a trench and a lead-out electrode are generally referred to as the gate electrode. A part not covered with the interlayer insulating film is referred to as a gate wiring line, including a part passing through a contact hole formed in the interlayer insulating film.

The specific examples of the invention have been explained in detail. However, the examples are for illustration only, and do not limit the scope of the claims. The technique described in the scope of the claims includes the foregoing examples with various modifications and changes. Each of and various combinations of the technical elements explained in this specification and the drawings achieve technical utility, and the technical elements are not limited to the combination stated in the claims at the time of filing. The technology explained in this specification and the drawings as an example is able to achieve the plurality of objectives simultaneously, and has technical utility by achieving one of the objectives.

What is claimed is:

1. A semiconductor device comprising:
   a semiconductor substrate;
   a trench provided on a top surface of the semiconductor substrate;
   a gate insulating film covering an inner surface of the trench;
   a trench gate electrode adjacent to the gate insulating film and accommodated in the trench; and
   a lead-out electrode provided on the top surface so as to extend along the top surface, the lead-out electrode being electrically connected to the trench gate electrode, wherein:
   when the top surface of the semiconductor substrate is planarly viewed, the trench has a linear portion in which a trench side surface extends linearly, and an end portion in which the trench side surface curves, the end portion being positioned on a longitudinal end side of the linear portion;
   when the top surface of the semiconductor substrate as planarly viewed from above, the lead-out electrode covers the end portion and reaches the linear portion; and
   when the top surface of the semiconductor substrate is planarly viewed from above, in an adjacent range in the end portion, the adjacent range being adjacent to a boundary line positioned between the top surface and the trench side surface, the top surface and the trench side surface are covered with the gate insulating film and an interlayer insulating film.

2. The semiconductor device according to claim 1, wherein:
   when the semiconductor substrate is planarly viewed, an opening where the end portion is exposed is formed in the lead-out electrode.

3. The semiconductor device according to claim 1, wherein
   in the end portion, a side surface of the trench gate electrode within the adjacent range is spaced from the trench side surface.

4. The semiconductor device according to claim 1, wherein
   the interlayer insulating film continues to an insulating film that insulates the trench gate electrode from a top surface electrode.

5. The semiconductor device according to claim 1, wherein
   a plurality of trenches extends in parallel to each other; and
   respective end portions of the trenches adjacent to each other are placed at different longitudinal positions.

6. The semiconductor device according to claim 1, wherein
   the lead-out electrode and a gate wiring line make contact with each other at a position on an extension line extending from the trench longitudinally.

* * * * *